US008619937B2

(12) United States Patent
Naujokat

(10) Patent No.: US 8,619,937 B2
(45) Date of Patent: Dec. 31, 2013

(54) INTEGRATED CMOS CLOCK GENERATOR WITH A SELF-BIASED PHASE LOCKED LOOP CIRCUIT

(75) Inventor: Joern Naujokat, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 1683 days.

(21) Appl. No.: 11/305,556

(22) Filed: Dec. 16, 2005

(65) Prior Publication Data

US 2006/0140325 A1 Jun. 29, 2006

(30) Foreign Application Priority Data

Dec. 23, 2004 (DE) .......................... 10 2004 062 209
Feb. 17, 2005 (DE) .......................... 10 2005 007 310

(51) Int. Cl.
*H03D 3/24* (2006.01)
(52) U.S. Cl.
USPC ........... 375/376; 375/215; 375/294; 375/327; 375/373; 375/374; 327/156; 331/16
(58) Field of Classification Search
USPC ......... 375/215, 354, 359, 371, 373, 374–376, 375/355, 360, 294, 295, 316, 327; 331/16
See application file for complete search history.

(56) References Cited

U.S. PATENT DOCUMENTS

| | | | |
|---|---|---|---|
| 6,259,755 B1 * | 7/2001 | O'Sullivan et al. | 375/376 |
| 7,251,305 B2 * | 7/2007 | Gauthier et al. | 375/376 |
| 7,292,106 B2 * | 11/2007 | Maneatis | 331/17 |
| 7,756,500 B1 * | 7/2010 | Fulga et al. | 455/266 |
| 2004/0201408 A1 * | 10/2004 | Brox et al. | 327/261 |
| 2005/0110537 A1 * | 5/2005 | Wurzer | 327/156 |
| 2006/0012441 A1 * | 1/2006 | Maneatis | 331/16 |
| 2006/0244542 A1 * | 11/2006 | Knoll et al. | 331/16 |

OTHER PUBLICATIONS

John G. Maneatis, Low-Jitter Process-Independent DLL and PLL Based on Self-Biased Techniques, IEEE Journal of Solid State Circuits, vol. 31, No. 11, Nov. 1996, pp. 1723-1732.

\* cited by examiner

*Primary Examiner* — Hirdepal Singh
(74) *Attorney, Agent, or Firm* — Alan A. R. Cooper; W. James Brady, III; Frederick J. Telecky, Jr.

(57) ABSTRACT

An integrated CMOS clock generator with a self-biased phase locked loop circuit comprises a phase-frequency detector with a reference signal input, a feedback signal input and an output. A first charge pump of the clock generator has an input connected to the output of the phase-frequency detector and an output that supplies a control voltage. A loop capacitor is connected to the output of the first charge pump. The clock generator further has a second charge pump with an input connected to the output of the phase-frequency detector and an output. In particular, the clock generator has two oscillator blocks.

3 Claims, 4 Drawing Sheets

INTEGRATED CMOS CLOCK GENERATOR WITH A SELF-BIASED PHASE LOCKED LOOP CIRCUIT

CROSS REFERENCE TO RELATED APPLICATIONS

This application claims priority under 35 USC §119 of German Application Serial No. 10 2004 062209.4, filed Dec. 23, 2004 and German Application Serial No. 10 2005 007 310.7, filed Feb. 17, 2005.

FIELD OF THE INVENTION

The present invention relates to an integrated CMOS clock generator with a self-biased phase locked loop circuit.

BACKGROUND OF THE INVENTION

Generally stated, a clock generator should generate an output clock signal with an exactly defined frequency and a low frequency and phase jitter. Low frequency and phase jitter means that the frequency and the phase of the output clock signal have low deviations in the frequency and in the phase compared with an ideal expected clock signal.

The output signal of a clock generator is generated by a phase-locked loop (PLL). The PLL has two main functions. The first one is to generate the output signal by performing a frequency multiplication of the input clock signal. The second one is to generate a clock signal with low frequency and phase jitter.

FIG. 1 shows a block diagram of a conventional phase-locked loop. The phase locked loop of FIG. 1 comprises a phase/frequency detector 105, a charge pump 107, a loop filter 109 and a voltage controlled oscillator 111. The output signal of the voltage controlled oscillator 111 represents an output clock signal 113 of the phase locked loop. The output clock signal 113 is fed to an input of the phase frequency detector 105 via a feedback frequency divider 115. A frequency divider 103 divides an input clock signal 101 and transfers the frequency divided signal to an input of the phase frequency detector 105. The output of the phase frequency detector 105 is transferred via the charge pump 107 and the loop filter 109 to the input of the voltage controlled oscillator 111. The signal input to the voltage controlled oscillator 111 is a voltage representative of the phase difference detected by the phase/frequency detector 105. In general, the voltage is not proportional to the phase difference. The voltage determines the frequency of the voltage controlled oscillator.

For applications with a wide output clock frequency range, the phase locked loop based on the self-biased technique developed by John Maneatis has become a standard solution; see John G. Maneatis: "Low-Jitter Process-Independent DLL and PLL Based on Self-Biased Techniques", IEEE Journal of Solid State Circuits, Vol. 31, No. 11, November 1996, page 1723-1732).

A block diagram of a standard self-biased phase locked loop is shown in FIG. 2. The phase locked loop of FIG. 2 comprises an input frequency divider 203, a feedback frequency divider 215, a phase/frequency detector 205, a first charge pump 217 connected to a first loop filter capacitor 221, a second charge pump 219 connected to a second loop filter capacitor 227, a first bias generator 223, which forms a loop filter resistance, a second bias generator 225 connected to a voltage controlled oscillator 211, which represents a chain of oscillator stages. An input clock signal 201 is transferred to the phase/frequency detector 205 via the input frequency divider 203. An output clock signal 213 from the voltage controlled oscillator 211 is fed back to the phase frequency detector 205 via the feedback frequency divider 215. The signals output from the phase/frequency detector 205 are input to both the first charge pump 217 and the second charge pump 219. The output signal from the first charge pump 217 is input to the first bias generator 223 via the first loop filter capacitor 221. The output signal from the second charge pump 219 is input to the second bias generator 225 via the second loop filter capacitor 227. The first output signal 231 of the first bias generator 223 is input to the second bias generator 225. The second output signal 233 from the first bias generator 223 is input to the first and second charge pump 217 and 219. The second bias generator 225 generates a first and a second output signal 235 and 237, which are both input to the voltage controlled oscillator 211.

Although the self-biased phase locked loop described by John Maneatis has only one bias generator, it has become standard to have a two bias generator topology as shown in FIG. 2. The second bias generator 225 separates the second charge pump 219 connected to the second loop filter capacitor 227 from the voltage controlled oscillator 211. Therefore the influence of current peaks coming from the second charge pump 219 on the jitter of the output clock signal 213 is reduced.

The standard self-biased phase locked loop has two advantages for wide output clock frequency applications. The damping factor is nearly fixed and nearly independent of the process variation. This leads to a very stable circuit. Furthermore, the phase locked loop bandwidth tracks only with the input/output clock frequency and does not have a variation like a non-self-biased phase locked loop. For an input clock signal having a high amount of jitter and distortion it is important to set the PLL loop bandwidth as low as possible in order to filter the higher frequency part of the input clock distortion/jitter out of the output clock signal. If the PLL loop bandwidth tracks only the input/output clock frequency, the filter characteristic is very stable.

FIG. 3 shows a gain curve of the standard self-biased phase locked loop of FIG. 2. The diagram of FIG. 3 depicts the frequency $f_{VCO}$ of the output clock signal 213 from the voltage controlled oscillator 213 versus the control voltage $V_{CTRL}$ at the input of the first charge pump 217. The control voltage $V_{CTRL}$ is defined as the supply voltage $V_{dd}$ minus the voltage $V_{C1}$ at the first loop filter capacitor 221;

$$V_{CTRL} = V_{dd} - V_{C1}.$$

The current flow into each oscillator stage of the VCO 211 increases as the control voltage $V_{CTRL}$ is increased. Therefore, the oscillation frequency becomes higher. A maximum desired application frequency $f_{max}$ is reached, if the control voltage is equal to $V_{max}$. A minimum desired application frequency $f_{min}$ is generated by applying a control voltage $V_{min}$ to the input of the VCO 211.

As mentioned above, a major function of the PLL is to generate an output clock signal having a low frequency jitter and a low phase jitter. Phase jitter is the deviation of the output phase from an ideal expected clock phase. Besides other possible causes, two PLL parameters determine the amount of clock jitter. The first one is the current flowing through each oscillator stage and the second one is the VCO gain. The VCO gain is defined as the ratio of the oscillator frequency change $\Delta f_{vco}$ to the control voltage change $\Delta V_{CTRL}$;

$$VCO\text{-gain} = \Delta f_{vco}/\Delta V_{CTRL}.$$

An increasing oscillator stage current diminishes the noise-power of the transistor noise sources. Therefore, the overall clock jitter is reduced. Consequently, it is always desirable to operate at a high current.

The influence/effect of the noise sources in front of the oscillator on the oscillator output signal is decreased by lowering the VCO gain. Therefore, the overall clock jitter is lowered. Consequently, the VCO gain should be as low as possible.

For a standard self-biased PLL topology, the VCO gain is determined by the maximum desired output frequency and the oscillator stage current is determined by the device current consumption specification.

In wide frequency applications, the output clock jitter performance depends on the output clock frequency. Although the VCO gain is nearly constant for the whole frequency range, the current flowing through the oscillator stages depends on the output clock frequency $f_{vco}$.

The oscillator stage current is high for high oscillation frequencies. Therefore, the noise-power of the internal transistor noise sources is low. In the end, the overall clock jitter has the lowest value.

If the phase locked loop generates lower oscillation frequencies, the oscillator stage current goes down to a lower value. This lets the noise-power of the internal transistor noise sources become larger and therefore the overall clock jitter increases too.

SUMMARY OF THE INVENTION

The present invention provides an integrated CMOS clock generator that has substantially reduced frequency and phase jitter over conventional approaches.

Specifically, the invention provides an integrated CMOS clock generator with a self-biased phase locked loop circuit that comprises a phase-frequency detector with a reference signal input, a feedback signal input and an output. A first charge pump of the clock generator has an input connected to the output of the phase-frequency detector and an output that supplies a control current. A loop capacitor is connected to the output of the first charge pump. The clock generator further has a second charge pump with an input connected to the output of the phase-frequency detector and an output. In particular, the clock generator has two oscillator blocks. The first oscillator block has a first bias generator with an input connected to the output of the first charge pump and an output, a capacitor connected to the output of the first bias generator, a second bias generator that has an input connected to the output of the first bias generator and an output, and a voltage controlled oscillator with a control input connected to the output of the second bias generator and an output. Likewise, the second oscillator block has a first bias generator with an input connected to the output of the first charge pump and an output, a capacitor connected to the output of the first bias generator, a second bias generator that has an input connected to the output of the first bias generator and an output, and a voltage controlled oscillator with a control input connected to the output of the second bias generator and an output. A first switch of the clock generator selectively connects the output of the second charge pump with the input of the second bias generator in the first oscillator block or with the input of the second bias generator in the second oscillator block. A second switch of the clock generator has a first input connected to the output of the voltage controlled oscillator in the first oscillator block and a second input connected to the output of the voltage controlled oscillator in the second oscillator block, and a clock output. A third switch of the clock generator selectively connects one of the differential outputs of the first bias generator in the first oscillator block or in the second oscillator block with parallel inputs of the first and second charge pumps. The clock generator has an oscillator select circuit that controls the first, second and third switches to select the voltage oscillator in either of the first and second oscillator blocks. The total frequency tuning range of the phase locked loop is thus divided into adjacent partial frequency ranges. Each of the voltage controlled oscillators in the two oscillator blocks provides output clock frequencies spanning a part of the total frequency tuning range.

The total clock frequency range extends from a minimum frequency to a maximum frequency. It is divided into a partial lower range and a partial upper range. The lower range extends from the minimum frequency substantially to an intermediate frequency value. The upper range extends substantially from the intermediate frequency value to the maximum frequency.

The intermediate frequency value may be a value calculated from the difference between the maximum and minimum frequencies divided by two.

BRIEF DESCRIPTION OF THE DRAWINGS

A preferred embodiment of the present invention is described hereinafter with reference to the accompanied drawings.

DETAILED DESCRIPTION OF THE DRAWINGS

Figure 1:
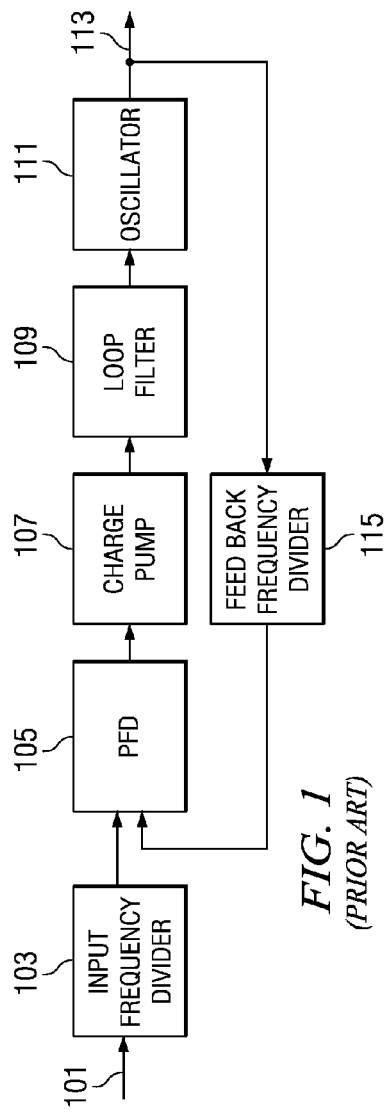
FIG. 1 shows a block diagram of a conventional phase locked loop.
Figure 2:
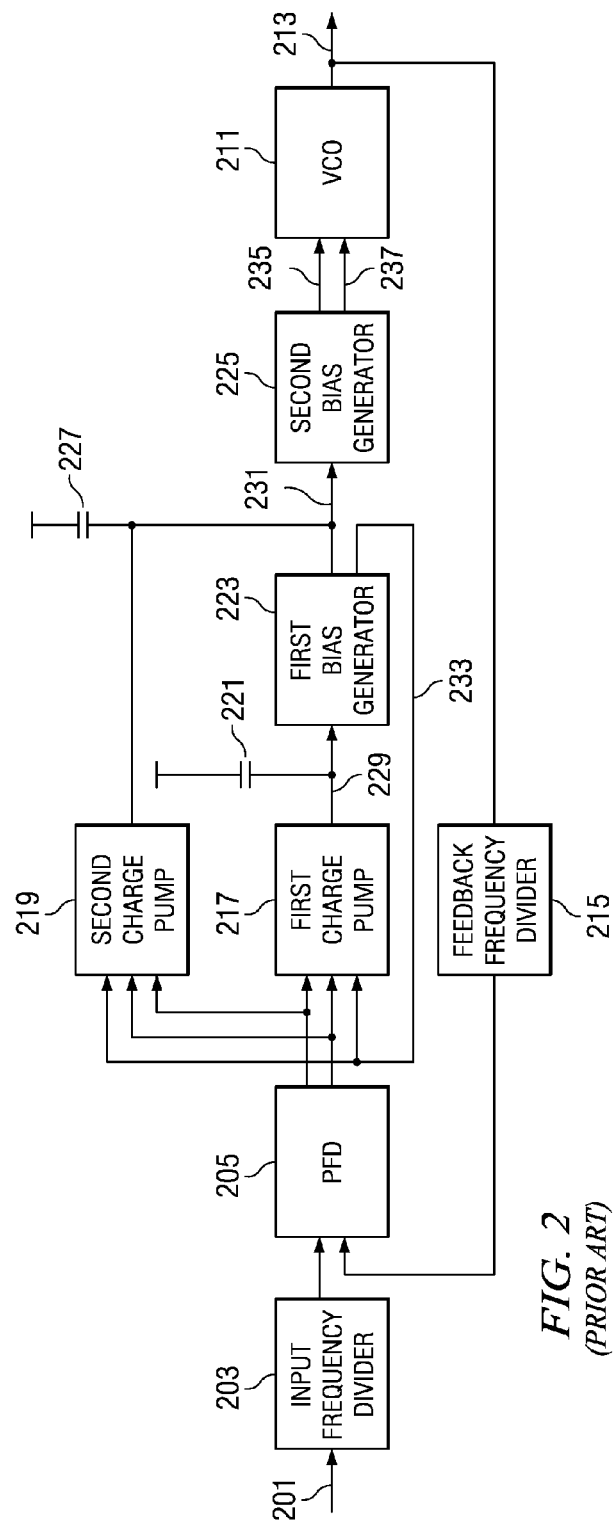
FIG. 2 shows a block diagram of a standard self biased phase locked loop according to the state of the art.
Figure 3:
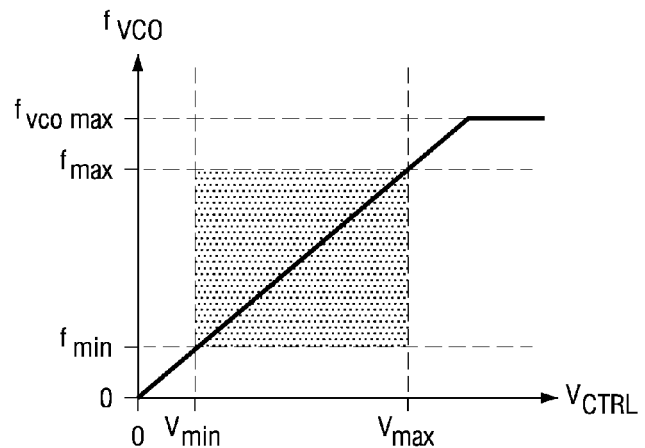
FIG. 3 shows a gain curve of the standard self-biased phase locked loop according to FIG. 2.
Figure 4:
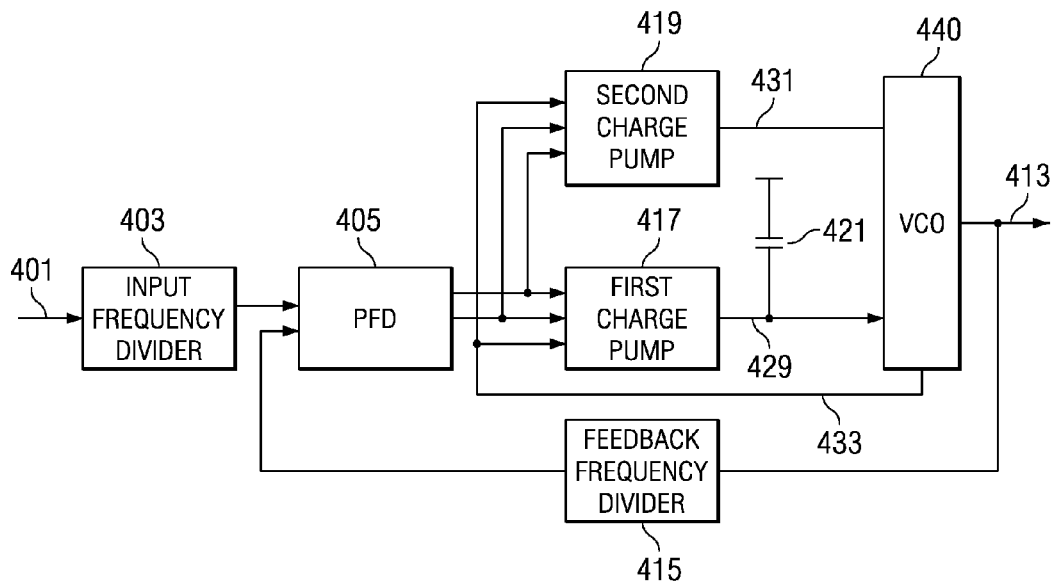
FIG. 4 shows a block diagram of a clock generator according to a first embodiment of the present invention.

With reference now to FIG. 4, instead of the single voltage controlled oscillator 211 with associated first and second bias generators 223, 225 and first and second loop filter capacitors 221 and 227, the preferred embodiment of the present invention has a dual bias generator and voltage controlled oscillator block 440.

Figure 5:
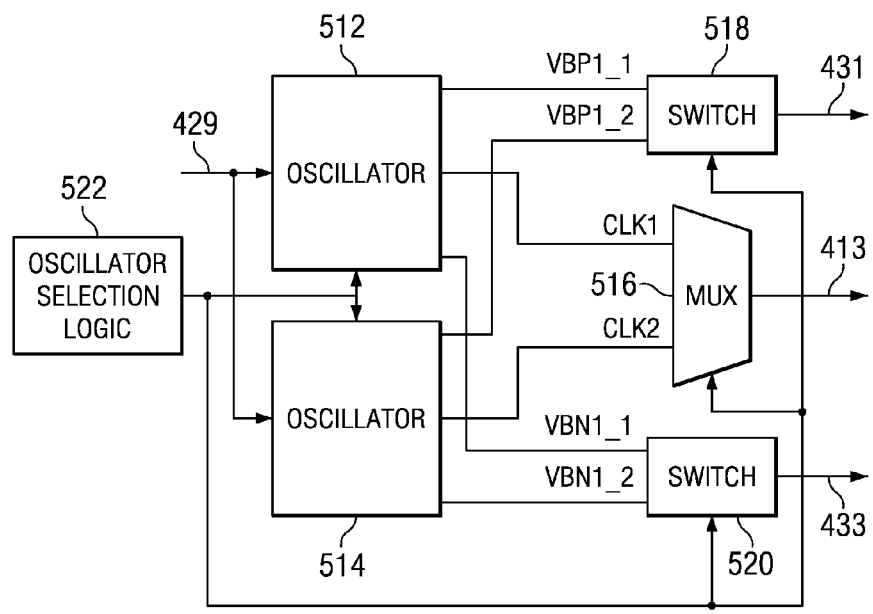
FIG. 5 shows a block diagram of a dual bias generator and voltage controlled oscillator block of FIG. 4.

FIG. 5 is a block diagram of the dual bias generator and voltage controlled oscillator block 440 in FIG. 4. Block 440 includes a first oscillator block 512 and a second oscillator block 514. The control voltage 429 is applied to a control input of each oscillator block 512 and 514. Each oscillator block 512 and 514 generates an output clock signal CLK1, CLK2 connected to one of two inputs of a switch (or multiplexer) 516 generating an output clock signal 413. A switch (or transfer gate) 518 has a first input connected to a first bias voltage terminal VBP1_1 of the first oscillator block 512 and a second input connected to a first bias voltage terminal VBP 1 2 of the second oscillator block 514. An output 431 of switch 518 is connected to the output of the second charge pump 419 to apply a bias voltage VBP. A switch (or transfer gate) 520 has a first input connected to a first bias voltage terminal VBN1_1 of the first oscillator block 512 and a second input connected to a first bias voltage terminal VBN1_2 of the second oscillator block 514. An output 433 of switch 520 is connected to an input of the first charge pump 417 and to an input of the second charge pump 419. An oscillator selection logic block 522 has a control output connected to control inputs of the oscillator blocks 512 and 514 and of the switches 516, 518 and 520.

Figure 6:
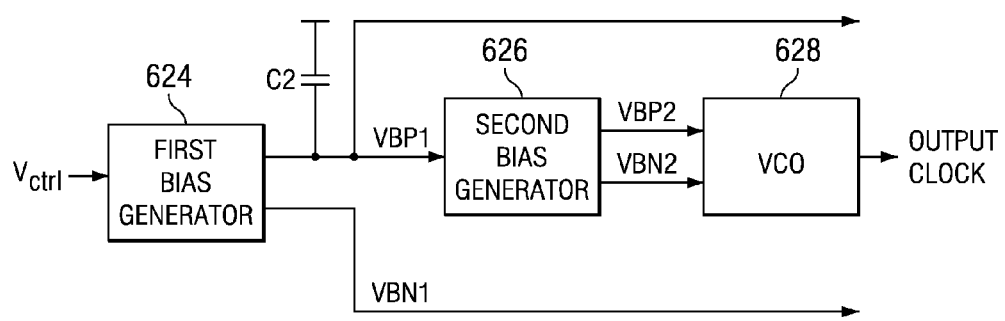
FIG. 6 shows a block diagram of one of the oscillator blocks 512 and 514 shown in FIG. 5.

FIG. 6 shows the details of each oscillator block 512, 514. Specifically, each oscillator block 512 and 514 has a first bias generator 624, a second bias generator 626 and a voltage controlled oscillator 628. A control input of bias generator 624 has the control voltage $V_{ctrl}$ applied thereto. The first bias generator 624 has bias voltage output VBP1 connected to the corresponding input of bias generator 626. The second bias generator 626 has bias voltage outputs VBP2 and VBN2 connected to corresponding inputs of voltage controlled oscillator 628. A capacitor C2 optimally dimensioned for the respective oscillator block is connected to the output of the first bias generator 624.

Figure 7A:
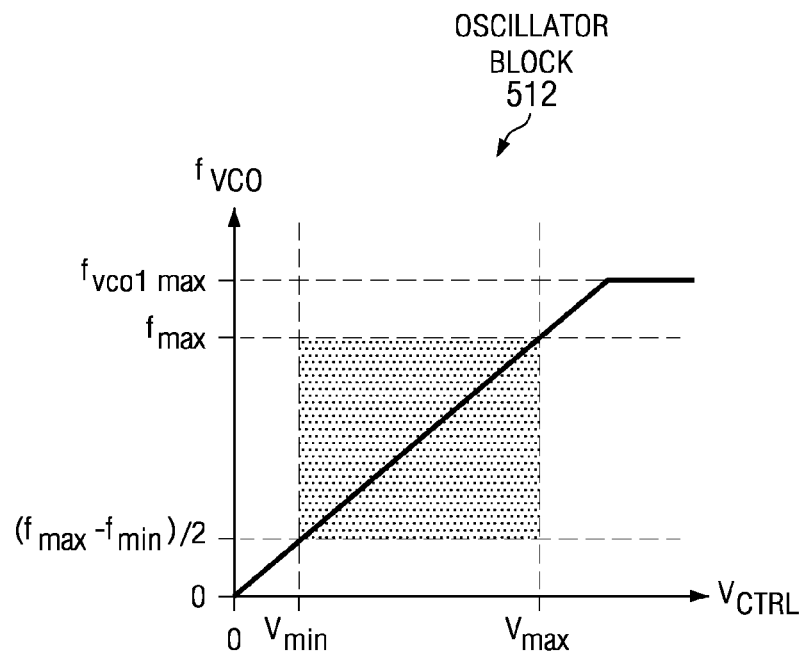
FIGS. 7*a* and 7*b* are charts that show the VCO gain curves of two oscillator blocks 512 and 514.
Figure 7B:
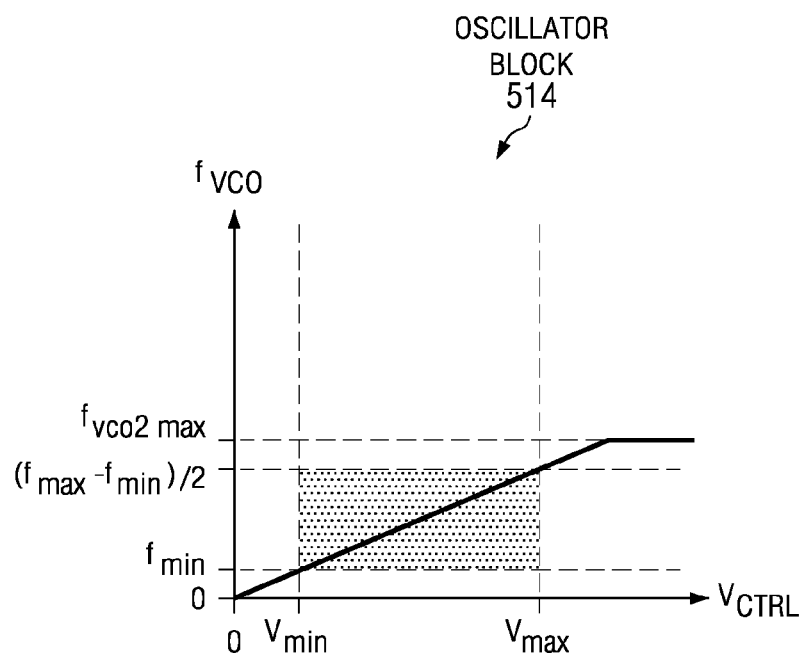

In operation, only one of the two oscillator blocks 512 and 514 is running. The selection of the active oscillator block 512 or 514 depends on the application clock frequency range. $f_{min}$ represents the minimum frequency and $f_{max}$ represents the maximum frequency of the clock frequency range. The first oscillator block 512 will be selected for the upper half of the output clock frequency range $[(f_{max}-f_{min})/2, f_{max}]$ and the second oscillator block 514 is switched on for the lower half of the output clock frequency range $[f_{min}, (f_{max}-f_{min})/2]$. The VCO gain curves of the two oscillator blocks 512 and 514 are shown in FIGS. 7a and 7b.

The VCO gain curve and the maximum current consumption of the first oscillator block 512 are the same as the VCO gain curve and the maximum current consumption of a standard, single VCO, self-biased PLL, because the VCO gain is determined by the maximum desired output clock frequency $f_{max}$ and the maximum current consumption is limited by the current consumption specification.

The VCO gain of the second oscillator block 514 has been reduced, because the maximum frequency of this oscillator block 514 needs only to be $(f_{max}-f_{min})/2$ instead of $f_{max}$.

This lower VCO gain reduces the influence/transfer function of the noise sources in front of the oscillator block 514 to the PLL output. In addition, the maximum current limit for the second oscillator block 514 is set to the maximum current limit of the first oscillator block 512. This means that the maximum allowed oscillator current is not only used for the maximum frequency $f_{max}$ of the first oscillator block 512, but also for the maximum frequency $(f_{max}-f_{min})/2$ of the second oscillator block 514. This leads to a great reduction of the clock jitter of the frequencies below $(f_{max}-f_{min})/2$. On the one side, this clock jitter reduction comes from the lower VCO gain of the second oscillator block 514. On the other side, this clock jitter reduction comes from the fact that the oscillator current of the second oscillator block 514 is higher than the oscillator current of a VCO in a standard, single VCO, self-biased PLL solution would be for the same output clock frequency.

As the new PLL topology uses the self-biased PLL technique, the charge pump currents have to track with the current through the bias generators and oscillator stages. This current tracking is achieved by mirroring the oscillator stage currents with a certain factor into the charge pumps. Here, in this dual oscillator topology, this current mirroring has to be possible for each of the two oscillators. Having the same charge pump current mirror factor for both oscillators, the NMOS biasing transistors of both oscillators have to be the same.

The new PLL consists not only of two different voltage controlled oscillators, but also of two different first bias generators. In general, the main purpose of the first bias generator is to represent the loop filter resistance. This is done by choosing a proper mirror factor between the oscillator stage and the output replica buffer of the bias generator. The advantage of having two different first bias generators [one first bias generator for each oscillator block] is that the loop filter resistance can be individually chosen for each oscillator block. The overall PLL transfer function which determines the damping factor and the PLL loop bandwidth depends, besides other parameters, on the VCO gain and the loop filter resistance. If the loop filter resistance in each oscillator was the same, the overall PLL transfer characteristic of the PLL would change with the selected VCO gain characteristic. The selection of the first oscillator would lead to a PLL transfer characteristic other than with the selection of the second oscillator. The worst case would be that the overall PLL is stable for only one of the two oscillators and the selection of the other oscillator would let the PLL transfer characteristic become unstable. In order to avoid this, it is proposed to compensate the influence of the different VCO gains. By having two independent first bias generators, each loop filter resistance can be individually chosen fitting to each VCO gain, so that the overall PLL characteristic is more independent from the selection of the oscillator.

The self biased PLL technique is based on the current mirroring between the bias generators, the oscillator stages and the charge pumps. Such current mirroring is achieved by having the different bias transistors matched in each block, but also by having a common bias voltage VBN for the charge pumps, the bias generators and the oscillator stages. This has to be considered for the integration of the two bias generator/oscillator blocks into the PLL circuitry. FIG. 5 shows that the right bias voltage VBN for the charge pumps and the right control voltage VBP coming from the charge pump 2 have to be selected depending on the selection of the right VCO. This is done by the two multiplexers. Each multiplexer consists of two transfer gates. One transfer gate connects the selected voltage to the output node and the other one disconnects the non-selected voltage from the output node. The transfer gate multiplexer 1 for the VBN biasing voltage allows that this charge pump biasing voltage is only determined by the selected VCO. The transfer gate multiplexer 2 for the VBP control voltage allows that the current of the second charge pump goes only to the selected oscillator block.

Only the selected loop filter capacitor C2 and the selected loop filter resistance R, which is represented by the first bias generator, becomes visible to the second charge pump. The path to the non-selected oscillator block is disconnected and the non-selected oscillator block is set to a power down mode.

Each oscillator block has its own loop filter capacitor C2. This gives the freedom to choose different C2 values individually for each oscillator block. Therefore not only the loop filter resistance R which is formed by the first bias generator but also the loop filter capacitor C2 can be individually set for each oscillator block. By choosing a good value of R and C2 for each oscillator block, a stable PLL characteristic for the dual VCO PLL can be achieved. This stable PLL characteristic is nearly independent from the oscillator block selection.

The selection of the right VCO can be done in several ways.

In a wide frequency application a simple control logic chooses the right oscillator block. The user of this clock generator device chooses the frequency multiplication factor for the specific application and applies the appropriate digital control word to the device. Then the internal control logic decides whether this factor leads to a high or low output clock frequency. As the multiplication factor indicates the desired output clock frequency, the selection logic is very simple.

Another way of selecting the right oscillator is to have a control circuitry implemented which detects whether the current output clock frequency increases or decreases and decides which oscillator is the right one to choose.

This new PLL circuit reduces the frequency and phase jitter of the output clock signal over a wide output clock frequency range compared to a standard self-biased PLL solution. Assuming both PLL solutions have the same maximum current consumption limit, the new PLL solution reduces the phase jitter for the lower frequency part of the entire output clock frequency range. The price to pay for the better phase jitter performance is a moderate IC area increase due to the additional oscillator stages, the two bias generators and the small loop filter capacitor C2.

As the self-biased principle is implemented into the new PLL circuit, the PLL characteristic of this new PLL is very stable and the PLL loop bandwidth tracks with the input/output frequency.

The invention claimed is:

1. An integrated Complementary Metal-Oxide-Semiconductor (CMOS) clock generator with a self-biased phase locked loop circuit comprising:
    a phase-frequency detector with a reference signal input, a feedback signal input and an output;
    a first charge pump with an input connected to the output of the phase-frequency detector and an output that supplies a control current;
    a loop capacitor connected to the output of the first charge pump;
    a second charge pump with an input connected to the output of the phase-frequency detector and an output;
    a first oscillator block including:
    a first bias generator that has an input connected to the output of the first charge pump and an output;
    a capacitor connected to the output of the first bias generator;
    a second bias generator that has an input connected to the output of the first bias generator and an output; and
    a voltage controlled oscillator with a control input connected to the output of the second bias generator and an output;
    a second oscillator block including:
    a first bias generator that has an input connected to the output of the first charge pump and an output;
    a capacitor connected to the output of the first bias generator;
    a second bias generator that has an input connected to the output of the first bias generator and an output; and
    a voltage controlled oscillator with a control input connected to the output of the second bias generator and an output;
    a first switch selectively connecting the output of the second charge pump with the input of the second bias generator in the first oscillator block or with the input of the second bias generator in the second oscillator block;
    a second switch with a first input connected to the output of the voltage controlled oscillator in the first oscillator block and a second input connected to the output of the voltage controlled oscillator in the second oscillator block and a clock output;
    a third switch for selectively connecting an output of the first bias generator in the first oscillator block or an output of the first bias generator in the second oscillator block with parallel inputs of the first and second charge pumps; and
    an oscillator select circuit controlling the first, second and third switches to select the voltage oscillator in either of the first and second oscillator blocks.

2. The clock generator of claim 1, wherein a total clock frequency range extending from a minimum frequency to a maximum frequency is divided into partial lower range and a partial upper range, and wherein the lower range extends from the minimum frequency substantially to an intermediate frequency value and the upper range extends substantially from the intermediate frequency value to the maximum frequency.

3. The clock generator of claim 2, wherein the intermediate frequency value is a value calculated from the difference between the maximum and minimum frequencies divided by two.

* * * * *